(12) United States Patent
Cangemi et al.

(10) Patent No.: US 9,482,790 B2
(45) Date of Patent: Nov. 1, 2016

(54) SILICA-MODIFIED-FLUORIDE BROAD ANGLE ANTI-REFLECTION COATINGS

(71) Applicant: CORNING INCORPORATED, Corning, NY (US)

(72) Inventors: Michael Jerome Cangemi, Canandigua, NY (US); Paul Gerard Dewa, Newark, NY (US); Joseph D Malach, Newark, NY (US); Paul Francis Michaloski, Rochester, NY (US); Horst Schreiber, Corning, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 525 days.

(21) Appl. No.: 13/834,008

(22) Filed: Mar. 15, 2013

(65) Prior Publication Data

US 2013/0321922 A1 Dec. 5, 2013

Related U.S. Application Data

(60) Provisional application No. 61/653,567, filed on May 31, 2012.

(51) Int. Cl.
*G02B 1/11* (2015.01)
*G02B 1/115* (2015.01)
(Continued)

(52) U.S. Cl.
CPC ............... *G02B 1/115* (2013.01); *G02B 1/10* (2013.01); *G02B 1/105* (2013.01); *G03F 7/7015* (2013.01); *G03F 7/70958* (2013.01)

(58) Field of Classification Search
CPC ........ G02B 1/115; G02B 1/10; G02B 1/105; G03F 7/7015; G03F 7/70958
USPC ......................................... 359/585, 580, 586
See application file for complete search history.

(56) References Cited

U.S. PATENT DOCUMENTS 7,128,984 B2 * 10/2006 Maier et al. ................. 428/696
7,242,843 B2 7/2007 Clar et al.
(Continued)

FOREIGN PATENT DOCUMENTS

| DE | 102009045170 | 4/2011 |
| EP | 1739801 | 1/2007 |

(Continued)

OTHER PUBLICATIONS

Wang et al; "Extended Lifetime of Fluoride Optics"; Proc of SPIE vol. 6720 p. 672001-1-672001-9.
(Continued)

*Primary Examiner* — Scott J Sugarman
*Assistant Examiner* — Kristina Deherrera
(74) *Attorney, Agent, or Firm* — Robert L. Carlson

(57) ABSTRACT

The disclosure is directed to a coating consisting of a binary metal fluoride coating consisting a high refractive index metal fluoride layer on top of a substrate, a low refractive index metal fluoride layer on top of the high refractive index layer and layer of $SiO_2$ or F—$SiO_2$ containing 0.2 wt % to 4.5 (2000 ppm to 45,000 ppm) F on top of the low refractive index layer. In one embodiment the F content of F—$SiO_2$ is in the range of 5000 ppm to 10,000 ppm F. The high index and low index materials are each deposited to a thickness of less than or equal to 0.9 quarter wave, and the capping material is deposited to a thickness in the range of 5 nm to 25 nm. The disclosure is also directed to optical elements having the foregoing coating and a method of making the coating.

7 Claims, 5 Drawing Sheets

(51) Int. Cl.
*G02B 1/10* (2015.01)
*G03F 7/20* (2006.01)

(56) References Cited

U.S. PATENT DOCUMENTS

| | | | |
|---|---|---|---|
| 7,456,581 B2 | 11/2008 | Lee et al. | |
| 7,561,611 B2 * | 7/2009 | Maier | 372/57 |
| 7,683,450 B2 | 3/2010 | Hart et al. | |
| 7,961,383 B2 | 6/2011 | Wang et al. | |
| 2006/0203218 A1 | 9/2006 | Shirai et al. | |
| 2007/0206286 A1 * | 9/2007 | Fukushige et al. | 359/580 |
| 2009/0141358 A1 * | 6/2009 | Cangemi et al. | C23C 14/06 359/586 |
| 2009/0297821 A1 | 12/2009 | Mikaelian | |
| 2010/0215932 A1 | 8/2010 | Schreiber et al. | |
| 2010/0297430 A1 | 11/2010 | Thies et al. | |

FOREIGN PATENT DOCUMENTS

| | | |
|---|---|---|
| EP | 1965229 A2 | 9/2008 |
| GB | 2431670 | 5/2007 |
| WO | 2009145871 | 12/2009 |

OTHER PUBLICATIONS

PCT/US2013/042967 Search Report.
Hitoshi Ishizawa et al, "Preparation of MgF2—SiO2 thin films with a low refractive index by a solgel process," Applied Optics 47(13), C200(2008).
Eric R. Marsh, Binu P. John and Jeremiah A. Couey, Jue Wang, Robert D. Greida, R. Ryan Vallance, "Predicting surface figure in diamond turned calcium fluoride using in-process force measurement," J. Vac. Sci. Technol. B 23(1), p. 84-89(2005).
Wolfgang Riede et al, "Laser-induced contamination on space optics," SPIE 8190, 81901E(2011).
Jue Wang, Robert L. Maier, "Color center formation of CaF2 (111) surface investigated by low-energy-plasma-ion," Frontier in Optics, 88th OSA annual meeting (2004).
Jue Wang, Robert L. Maier, "Correlation between mechanical stress and optical properties of SiO2/Ta2O5 multilayer UV NBF deposited by plasma ion-assisted deposition," SPIE 5870, 58700E1-9(2005).
Jue Wang, Robert L. Maier, Horst Schreiber, "Crystal phase transition of HfO2 films evaporated by plasma ion-assisted deposition," Applied Optics 47(13), C189-192(2008).
Jue Wang, Robert L. Maier, Horst Schreiber, "Elastic and plastic relaxation of densified SiO2 films," Applied Optics 47(13), C131-134(2008).
Jue Wang, Colleen R. Clar, Horst Schreiber, "Extended lifetime of fluoride optics," Boulder Damage Symposium, SPIE 6720-24 (2007).
Jue Wang, Robert Maier, Paul G. Dewa, Horst Schreiber, Robert A. Bellman, David Dawson Elli, "Nanoporous structure of a GdF3 thin film evaluated by variable angle spectroscopic ellipsometry", Applied Optics vol. 46(16), 3221-3226(2007).
Jue Wang, Bin Zhou, Jun Shen, Guangming Wu, "Optical coatings with ultralow refractive index $SiO_2$ films," SPIE 7504, 75040F(2009).
Jue Wang, Robert L. Maier, "quasi-Brewster angle technique for evaluation the quality of optical surface," SPIE 5375, 1286-1294(2004).
Jue Wang, Horst Schreiber, Ronald Davis, Bryan Wheaton, "Structural comparison of GdF3 films grown on CaF2 (111) and SiO2 substrates," Applied Optics vol. 47(23), 4292 (2008).
Jue Wang, Robert L. Maier, "Surface assessment of CaF2 DUV and VUV optical components by quasi-Brewster angle technique," Applied Optics 45(22), 5621-5628(2006).
Jue Wang, Robert L. Maier, John H. Burning, "Surface characterization of optical-ly polished CaF2 crystal by quasi-Brewster angle technique," SPIE 5188, 106-114(2003).
Jue Wang, Robert L. Maier, Horst Schreiber, "Wavefront control of SiO2-based ultraviolet narrow-bandpass filters prepared by plasma ion-assisted deposition", Applied Optics vol. 46(2), pp. 175-179(2007).

* cited by examiner

SILICA-MODIFIED-FLUORIDE BROAD ANGLE ANTI-REFLECTION COATINGS

PRIORITY

This application claims the priority and benefit of U.S. Provisional Application No. 61/653,567 titled "Silica-Modified-Fluoride Broad Angle Antireflection Coatings" filed May 31, 2012 in the name of inventors Michael Jerome Cangemi, Paul Gerard Dewa, Joseph D. Malach, Paul Francis Michaloski, Horst Schreiber and Jue Wang.

FIELD

The disclosure is directed to environmentally stable and laser durable optical coatings optics that will be used lithography systems operating in deep ultraviolet ("DUV") wavelength range.

BACKGROUND

As semiconductor processing progresses 45 nm node and beyond, the applications of ArF excimer lasers with increasing power and repetition rate require low loss, environmentally stable and laser durable coatings for optical components and systems for laser optics and precision optics. Surface and coating technologies will play a critical role in supporting the use precision optics and laser optics in DUV spectral regime. Wide band-gap fluoride thin films are generally preferred as coating for DUV uses.

At 193 nm wavelength, a well-prepared substrate surface is one of the dominant preconditions for good optical coatings, which includes surface finishing and cleaning prior to optical coatings, various methods such as optical polishing (Jue Wang, Robert L. Maier, John H. Burning, "Surface characterization of optically polished $CaF_2$ crystal by quasi-Brewster angle technique," SPIE 5188, 106-114(2003)); magnetorheological finishing (MRF) (Jue Wang, Robert L. Maier, "Quasi-Brewster angle technique for evaluation the quality of optical surface," SPIE 5375, 1286-1294(2004)); diamond turning (Eric R. Marsh et al, "Predicting surface figure in diamond turned calcium fluoride using in-process force measurement," J. Vac. Sci. Technol. B 23(1), p 84-89 (2005)); Ultrasonic/megasonic and ultraviolet ozone cleaning (Jue Wang, Robert L. Maier, "Surface assessment of $CaF_2$ DUV and VUV optical components by quasi-Brewster angle technique," Applied Optics 45(22), 5621-5628 (2006)); in-situ plasma ion cleaning (Jue Wang et al., "Color center formation of $CaF_2$ (111) surface investigated by low-energy-plasma-ion," Frontier in Optics, 88th OSA annual meeting (2004)). Improved optical surface quality extends component lifetime (U.S. Pat. No. 7,128,9847, "Improved surfacing of metal fluoride excimer optics" and U.S. Pat. No. 7,242,843, "Extended lifetime excimer laser optics"). Optical coating development has focused on fundamental understanding of film growth mechanism and plasma ion interaction (Jue Wang et al., "Correlation between mechanical stress and optical properties of $SiO_2$/$Ta_2O_5$ multilayer UV NBF deposited by plasma ion-assisted deposition," SPIE 5870, 58700E1-9(2005); Jue Wang et al., "Elastic and plastic relaxation of densified $SiO_2$ films," Applied Optics 47(13), C131-134(2008); Jue Wang et al, "Crystal phase transition of HfO2 films evaporated by plasma ion-assisted deposition," Applied Optics 47(13), C189-192(2008); Jue Wang et al., "Wavefront control of $SiO_2$-based ultraviolet narrow band pass filters prepared by plasma ion-assisted deposition", Applied Optics Vol. 46(2), pp 175-179(2007); and Jue Wang et al., "Nanoporous structure of a $GdF_3$ thin film evaluated by variable angle spectroscopic ellipsometry", Applied Optics Vol. 46(16), 3221-3226(2007)). This understanding has led to new optical thin film design and coating process improvements; from oxide materials to fluoride materials and ultimately oxide-fluoride hybrids (U.S. Pat. No. 7,961,383, Jue Wang et al., "Extended lifetime of fluoride optics," Boulder Damage Symposium, SPIE 6720-24 (2007); Jue Wang et al., "Structural comparison of $GdF_3$ films grown on $CaF_2$ (111) and $SiO_2$ substrates," Applied Optics Vol. 47(23), 4292 (2008); and Jue Wang et al., "Optical coatings with ultralow refractive index $SiO_2$ films," SPIE 7504, 75040F(2009)).

Wide band-gap fluoride thin films are generally preferred as coating for DUV uses. Using energetic deposition process is restricted for fluoride materials, because of fluorine depletion. The porous nature of thermal-evaporated fluoride coatings leads to measureable scatter loss and environmentally unstable. To overcome the porous nature of the metal fluoride coatings ($MF_x$ where x=2 or 3), hybrid oxide-fluoride coating were developed in which fluoride doped silica (F—$SiO_2$) layers was inserted into stacks of $MF_x$ coating layers (U.S. Pat. No. 7,961,383). In addition, and outermost F—$SiO_2$ layer was applied as a top of capping layer. However, these coating are relatively thick, and the problem still remains with regard to providing both environmental protection and anti-reflections properties to optics suitable for use in the DUV region. The present disclosure is directed to overcoming the shortcoming of the current environmental AR coatings for fluoride optics.

SUMMARY

The disclosure is directed to silica-modified-fluoride AR coatings for use in the DUV region and process for making them. The attributes of these coatings include:
(1) A reflectance less than 0.5% over a broad angle of incidence which is necessary for lens surfaces operating in the DUV, this broad angle AR performance to ensures a high system throughput;
(2) The coating prevents environmental substances from penetrating into the underneath fluoride layers and reducing optical performance; and
(3) The coating surface is chemically non-reactive to environmental substances.

The coating of the of disclosure consists of a binary metal fluoride coating consisting of a high refractive index $MF_2$ species and a low refractive index species, and a capping or last layer of $SiO_2$ or F—$SiO_2$ containing 0.2 wt. % to 4.5 wt. % (2000 ppm to 45,000 ppm) F in the capping layer. In one embodiment the F content is in the range of 5000 ppm to 10,000 ppm F.

BRIEF DESCRIPTION OF THE DRAWINGS

FIG. 1B FIGS. 2A and 2B are cross-sectional images of an oxide-fluoride hybrid AR coating, FIG. 2A, and an all fluoride AR coating, FIG. 2B

DETAILED DESCRIPTION

Herein the terms "half wave," quarter wave" and "less than quarter wave" are used in reference to the thickness of the layers of a coating materials deposited on an optic. Such terms are dependent on the wavelength of light, for example 193 nm laser light, with which they are used. Consequently, the thicknesses can vary. For example, for 193 nm light the quarter-wave thickness is 48.25 nm,±1% for variations in coating techniques and equipment. Hence, the terms are to be understood in relationship to the laser system with which the optics are to be used. Also herein, while the examples are given in terms of $CaF_2$ optics because these are the preferred optics for DUV applications, it is to be understood that that in a general sense the applications can be used with $MF_2$ optics where M is Ca, Ba, Mg or Sr, or mixtures thereof, or with $SiO_2$ substrates The disclosure is directed to silica-modified-fluoride AR coatings for use in the DUV region and process for making them. The attributes of these coating include:

(1) A reflectance less than 0.5% over a broad angle of incidence which is necessary lens surfaces operating in the DUV, this broad angle AR performance to ensures a high system throughput;

(2) The coating is prevents environmental substances from penetrating into the underneath fluoride layers and reducing optical performance; and (3) The coating surface is chemically non-reactive to environmental substances.

Figure 1A:
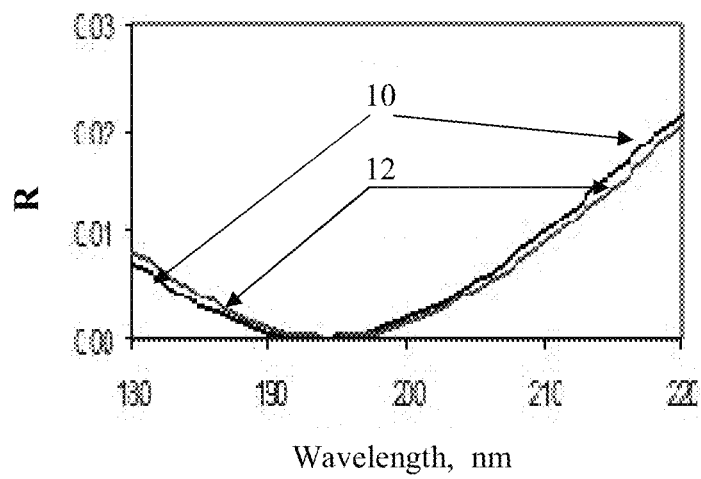
FIGS. 1A and 1B are graphs illustrating the DUV spectral reflectance of an oxide-fluoride hybrid AR coating, FIG. 1A, and an all fluoride AR coating.
Figure 1B:
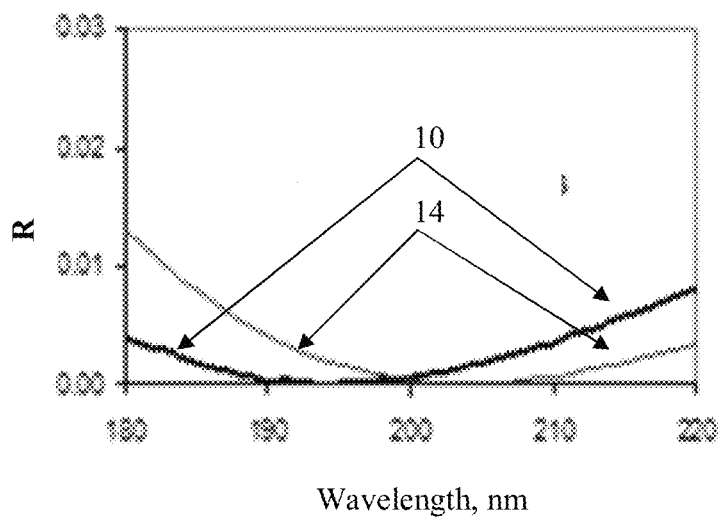
Figure 2A:
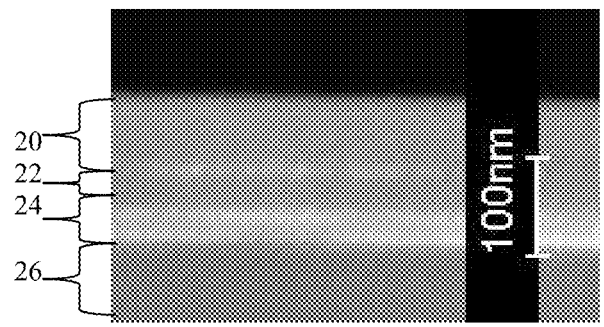
Figure 2B:
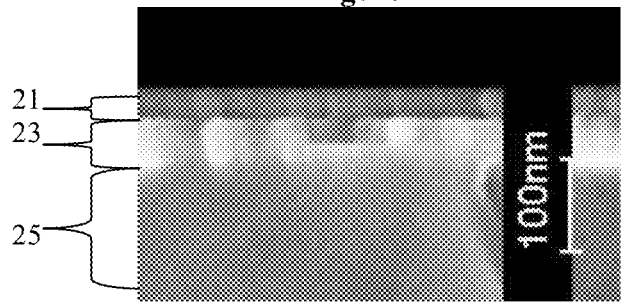

FIGS. 1A and 1B are graphs of DUV spectral reflectance (R) versus wavelength and compare the spectral of the oxide-fluoride hybrid anti-reflection (AR) coating (FIG. 1A) to a standard fluoride A coating (FIG. 1B). Numeral 10 in each Figure represents the measurement performed right after deposition of the coating film. After a five (5) month laboratory exposure, the center wavelength shift of the hybrid AR denoted by numeral 12 in FIG. 1A is negligible, whereas the environmental effect is significant for the standard fluoride AR of FIG. 1B in which after a 7-day lab exposure to the environment there is a center wavelength shift to 206 nm from 193 nm. FIGS. 2A and 2B are SEM cross-sectional images of the oxide-fluoride hybrid AR (FIG. 2A) and the standard fluoride AR (FIG. 2B). The hybrid AR coating of FIG. 2A with improved film structure is clearly revealed by SEM. FIG. 2A show a substrate 26 having an oxide-fluoride hybrid AR coating. The oxide-fluoride hybrid AR coating consists of a quarter-wave high refractive index fluoride layer 24, for example without limitation $GdF_3$ or $LaF_3$, and a quarter-wave low refractive index fluoride layer 22, for example without limitation $AlF_3$ or $MgF_2$, followed by a half-wave silica layer 20, for example $SiO_2$ or F—$SiO_2$ as the outermost sealant or capping layer. In contrast, FIG. 2B shows a substrate 25 having a standard fluoride AR coating. The standard fluoride AR coating comprises a quarter-wave high refractive index fluoride layer 23 followed by a quarter-wave low refractive index fluoride layer 21 with no oxide capping layer.

Figure 3:
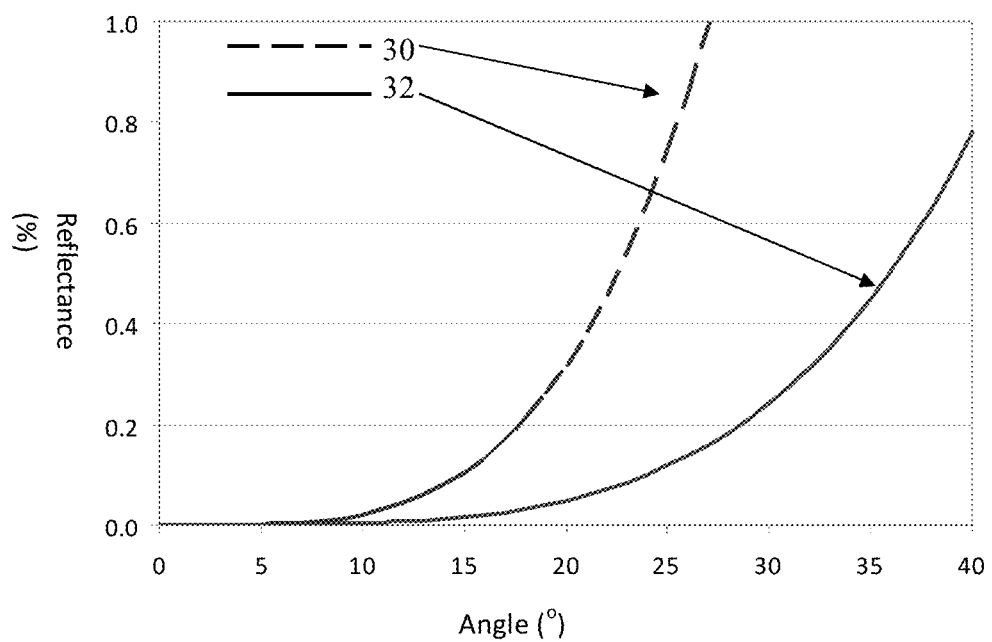
FIG. 3 is a graph illustrating the spectral reflectance of an oxide-fluoride hybrid AR coating 30 and a standard 2-layer fluoride AR coating 32 on $CaF_2$ substrates as a function of an angle of incidence.

The hybrid approach enables low loss and environmentally stable DUV coatings on flat or near flat surfaces for a specific angle of incidence. For optical systems, especially inspection objectives, an AR coating with a reflectance less than 0.5% over a broad angle of incidence is desired for every surface. This presents some challenges for the standard hybrid AR coatings which are:

1. The oxide-fluoride hybrid AR coating does not provide a broad angle spectral performance. FIG. 3 is a graph illustrating plots spectral reflectance of an oxide-fluoride hybrid AR coating 30 along with a standard 2-layer fluoride AR coating 32 as a function of angel of incidence. The standard 2-layer fluoride AR coating consists of one quarter-wave $GdF_3$ as the first layer deposited on a $CaF_2$ substrate, followed by one quarter-wave $AlF_3$ as the second layer. The oxide-fluoride hybrid AR coating has an additional half-wave silica capping layer on top of the standard 2-layer fluoride AR coating. The broadness of the angle of incidence with reflectance less than 0.5% is reduced to 22° for the hybrid coating from 36° for the standard coating at a wavelength of 193 nm.

Figure 4:
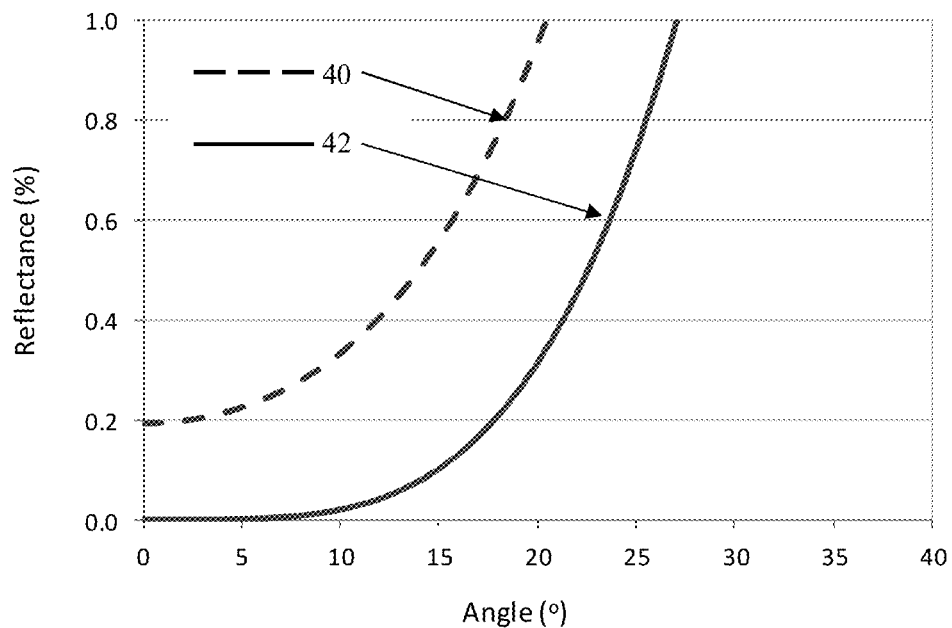
FIG. 4 is a graph illustrating the spectral reflectance of an oxide-fluoride hybrid AR coating 40 and the AR coating with a 2% thickness falloff as numeral 42.
Figure 5:
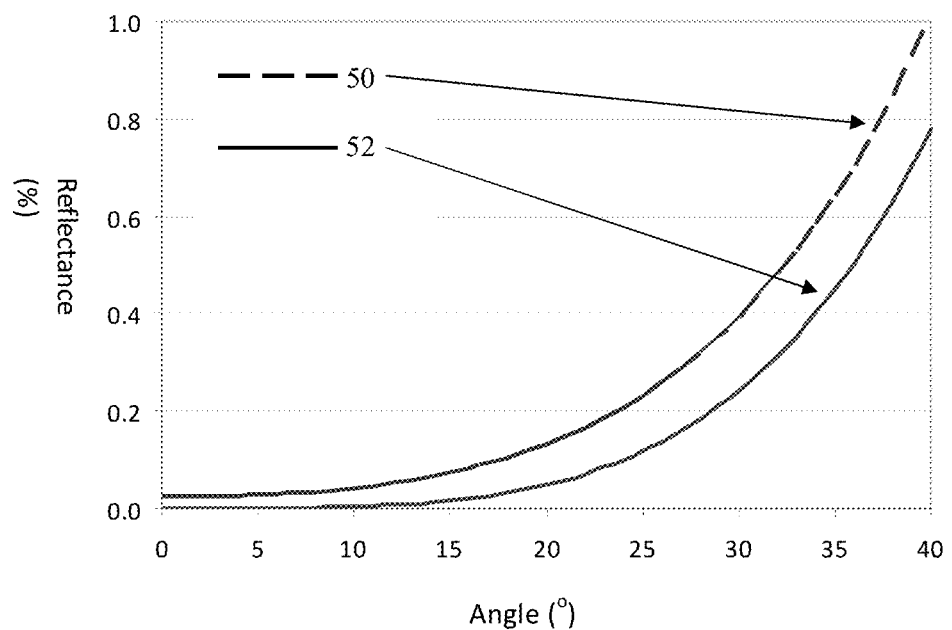
FIG. 5 is a graph illustrating the spectral reflectance shift of a standard 2-layer quarter-wave AR coating 50 and the AR coating with a 2% thickness falloff as numeral 52.

2. The oxide-fluoride hybrid AR coating is more sensitive to coating thickness fall-off when compared to the standard fluoride AR coating. FIG. 4 is a graph illustrating the spectral reflectance shift of the oxide-fluoride hybrid AR coating 40 with 2% thickness falloff (curve 42). The broadness of the angle of incidence with reflectance less than 0.5% is reduced to 14° from 23° at a wavelength of 193 nm. For comparison, FIG. 5 plots the spectral reflectance shift of the standard 2-layer fluoride AR 50 coating with 2% thickness falloff (curve 52). The broadness of the angle of incidence with reflectance less than 0.5% is reduced to 33° from 36°.

The technical challenge is to achieve appropriate environmental protection while maintaining a reasonable AR performance including low reflectance over a broad angle of incidence. In general, there are 2 potential technical solutions. One is a chemical method, such as sol-gel derived broad angle AR coatings with chemical modification to enhance coating durability and environmental stability (see Jue Wang et al., "Optical coatings with ultralow refractive index $SiO_2$ films," SPIE 7504, 75040F(2009); Hitoshi Ishizawa et al, "Preparation of $MgF_2$—$SiO_2$ thin films with a low refractive index by a sol-gel process," Applied Optics 47(13), C200(2008); and U.S. Patent Application Publication No. 2010/0297430). The other is a physical method that has been addressed with quarter-wave capping for high reflective coatings and antireflective coatings at 193 nm (U.S. Patent Application Publication Nos. 20100215932A1 and 2009.0297821, and U.S. Pat. No. 7,961,383). The results from analysis of the foregoing Figures clearly indicate that quarter-wave silica capping is too thick to provide a broad angle performance. The present disclosure reveals that a thin silica modified non-quarter-wave fluoride AR coating will provide the desired protection.

In the present disclosure a 3-step approach is employed to deal with the technical challenges mention above. The first step is to reduce the capping layer thickness from a half-wave (~60 nm) down to less than 20 nm. The second step is to replace the quarter-wave fluoride AR coating with a non-quarter-wave fluoride AR coating. The third step is to densify the thin silica layer, using for example $SiO_2$ or $F—SiO_2$, without introducing additional absorption of the underneath fluoride layers. The densification process of the thin silica layer includes high temperature deposition (T≥300° C.), reversed mask deposition technique, and in-situ or post-deposition plasma-ion treatment.

The advantages of the silica-modified-fluoride AR coating as described in the paragraph above include:
1. Providing appropriate physical capping so that less environmental substances can penetrate into the underneath fluoride layers
2. Offering surface chemical modification so that the surface is chemically inactive to environmental substances
3. Maintaining a broad-angle AR performance to ensure a high system throughput
4. Recovering optical performance by enabling surface cleaning when contamination occurs
5. Providing appropriate surface protection for handling and mounting coated optical elements Fluorides are generally the materials of choice in optical coatings for laser optics and precision optics operating at 193 nm. However, the usage of energetic deposition process is restricted for fluoride materials. The porous nature of thermally-evaporated fluoride coatings leads to measureable scatter loss and the coatings are environmentally unstable. In order to cope with the challenges that fluoride coatings have presented, oxide-fluoride hybrid ArF laser optic coatings have been developed and commercialized in laser optics business. The basic concept of the oxide-fluoride hybrid coatings is to insert $F—SiO_2$ layers into fluoride stacks for interface smoothing and to apply an additional $F—SiO_2$ layer on top of HR (highly reflective) coatings for capping, whereas for PR (partially reflective) and AR coatings, an outermost $F—SiO_2$ layer is deposited of top of fluoride multilayers to seal the porous structure of the fluoride coatings. This technical approach results in low scatter loss and environmentally stable DUV coatings on flat or near flat surfaces for a specific angle of incidence.

For optical systems, especially inspection objectives, AR coatings with a reflectance less than 0.5% over a broad angle of incidence is anticipated for lens surfaces which are curved. This presents some challenges for the existing hybrid AR coatings. The first challenge is that the oxide-fluoride hybrid AR coating works only for a specific angle of incidence. In other words, the oxide-fluoride hybrid AR coating has a limited angular broadness. A comparison of spectral reflectance an oxide-fluoride hybrid coating, FIG. 1A, and an all fluoride coating, FIG. 1B, as a function of angle of incidence of a oxide-fluoride hybrid AR coating and a standard 2-layer fluoride AR coating is presented in FIG. 1. The broadness of the angle of incidence with reflectance less than 0.5% is reduced to 22° from 36° at a wavelength of 193 nm. Second, the oxide-fluoride hybrid AR coating is more sensitive to coating thickness falloff when compared to the standard fluoride AR coating. As plotted in FIG. 4, the spectral reflectance shift of the oxide-fluoride hybrid AR coating with 2% thickness falloff. A 61% reduction of angular broadness appears at a wavelength of 193 nm when a 2% thickness falloff is considered. For comparison shown in FIG. 5, a 92% reduction of angular broadness of the standard fluoride AR coating with the same amount of thickness falloff is considered.

A 3-step approach is employed to deal with the technical challenge in order to achieve an appropriate environmental protection while maintaining low reflectance over a broad angle of incidence:
1. The first step is to reduce capping layer thickness from a half-wave (~60 nm) down to less than 25 nm.
2. The second step is to replace a quarter-wave fluoride AR with a non-quarter-wave fluoride AR.
3. The third step is to densify the thin silica layer without introducing additional absorption of the underneath fluoride layers. The densification process of the thin silica layer includes high temperature deposition, reversed mask technique and in-situ or post-deposition plasma-ion treatment.[28]

Figure 6:
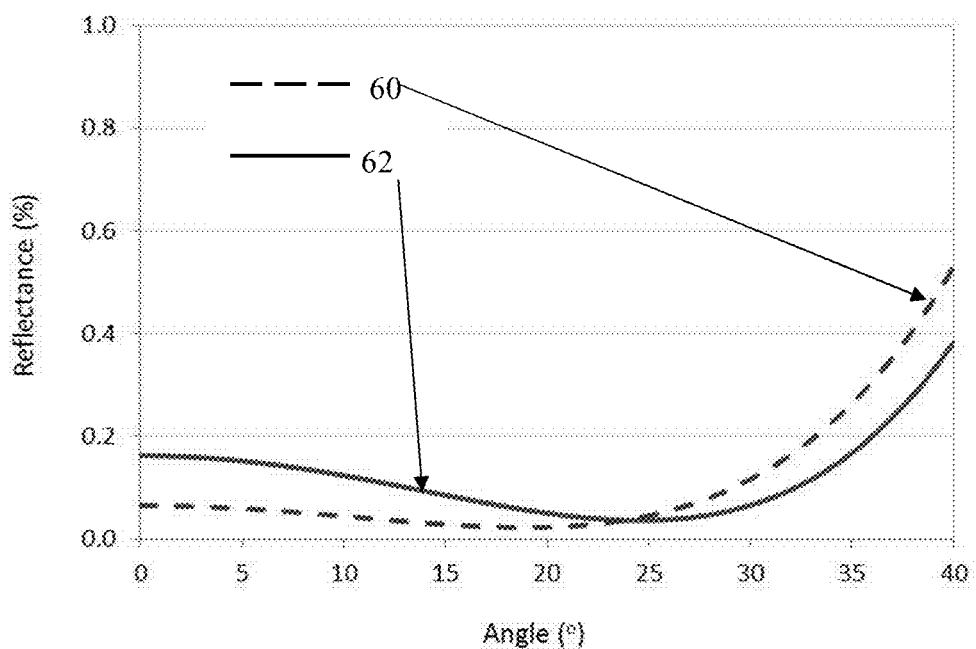
FIG. 6 is a graph of the spectral reflectance of an oxide-modified 3-layer AR coating 60 and the AR coating with a 2% falloff as numeral 62; the 3-layer coating consisting of 2-layers of fluorides with an additional 5 nm thick $SiO_2$ coating as the outermost surface modification for laser use.

For example, FIG. 6 plots spectral reflectance as a function of angle of incidence of an oxide-modified fluoride AR coating. The modified AR coating 60 consists of 3 layers. Starting from the $CaF_2$ substrate there are 2 layers of non-quarter-wave fluorides (0.9 quarter-wave thick $GdF_3$ and $AlF_3$) and an addition of 5 nm-thick silica layer for surface modification. The shift of a oxide-modified 3-layer AR coating 60 and the AR with 2% thickness falloff, curve 62. The 3-layer oxide-modified-fluoride AR coating provides a broad angle of incidence up to 40° (curve 60 in FIG. 6). The angular broadness maintains when a 2% thickness falloff is considered (curve 62 in FIG. 6).

Figure 7:
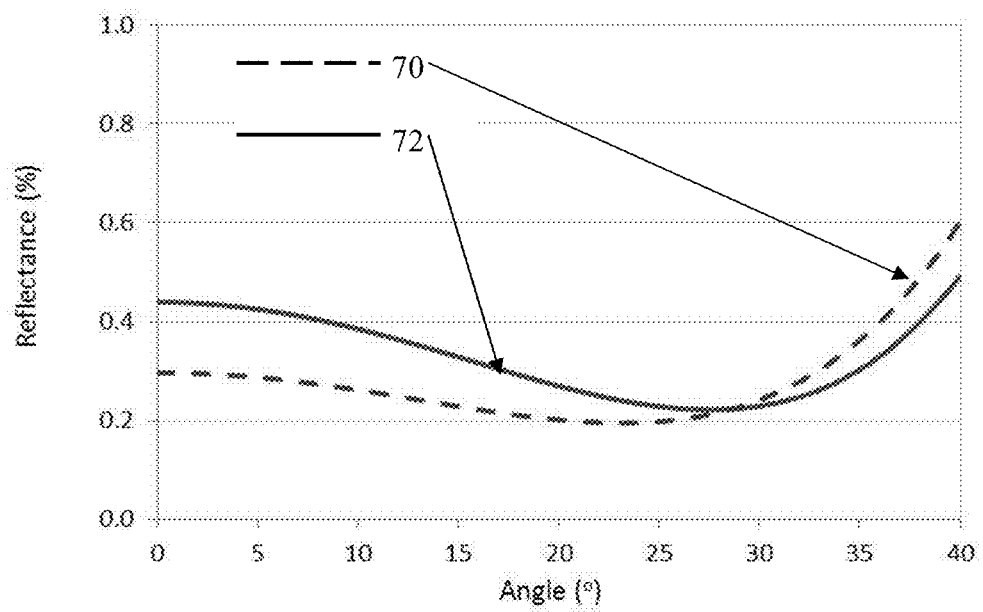
FIG. 7 is a graph illustrating the spectral reflectance of an oxide-modified 3-later AR coating 70 and the AR coating with a 2% thickness falloff illustrated as numeral 72; the 3-layer Ar coating consisting of 2 layer of fluorides with an additional 10 nm thick coating as the outermost surface layer for laser use.

Another example of the oxide-modified-fluoride AR coating 70 is presented in FIG. 7, showing spectral reflectance as a function of angle of incidence. The modified AR coating consists of 3 layers. Starting from $CaF_2$ substrate there are 2 layers of non-quarter-wave fluorides (0.78 quarter-wave thick $GdF_3$ and $AlF_3$) and an addition of 10 nm-thick silica layer for surface modification. The 3-layer oxide-modified-fluoride AR coating provides a broad angle of incidence up to 38° (curve 70 in FIG. 7). When a 2% thickness falloff is considered (curve 72 in FIG. 7), an angular broadness of 40° is achieved.

There are several advantages of the silica modified fluoride AR coatings:
1. To provide appropriate physical capping so that few environmental substances can penetrate into the underneath fluoride layers. The top surface contaminates can be cleaned up via appropriate cleaning methods
2. To offer surface chemical modification so that the surface is chemically inactive to environmental substances
3. To maintain a broad-angle AR performance to ensure a high system throughput
4. To provide appropriate surface protection for handling and mounting coated optical elements As an added benefit, the oxide-fluoride hybrid DUV coatings of this disclosure can reduce the risk of laser-induced contamination. Trace amounts of volatile organic substances are omnipresent in DUV laser systems from metal housings and organic potting compound to purge gas lines. Photo-decomposition of the organic substances under 193 nm laser irradiation is the potential source of selective contaminations on the optical surfaces. Accumulated absorption on multiple optical surfaces over a time period of laser exposure may lead to unacceptable transmission loss and system degradation. The length of such time period and is dependent on the power at which the laser operates and the amount of contaminants to which the optics are exposed. Using thin oxide films as disclosed herein as a top layer can reduce the risk of laser-induced contamination on the optical surfaces when compared to that of fluoride surfaces. Similar effects have been also reported in space optics where the optics are exposed to contaminants within the spacecraft and solar radiation unfiltered by earth's atmosphere.

It is also here noted that although only 2-layer fluoride AR coatings are used as examples in this disclosure, silica modified fluoride AR coating approach described herein can apply to other multilayer fluoride AR coatings to further broad angular performance or cover a strong surface curvature with large thickness falloff, although only 2-layer fluoride AR coatings are used as examples in this document. It is further noted that the teaching disclosed herein can be used with having flat surfaces such as prisms and some mirrors, the teaching can also be applied to optics having a curvature such as lenses and curved mirrors.

Thus, in one embodiment the disclosure is directed to an optical coating for laser optics, the coating consisting of a high refractive index metal fluoride material, a low refractive index metal fluoride material and a capping coating selected from the group consisting of $SiO_2$ and F—$SiO_2$ on a substrate, wherein the high and low index metal fluorides are applied to a less than quarter wave thickness and the capping coating is applied to a thick in the range of 5 nm to 25 nm. Each of the high refractive index and low refractive index metal fluorides are applied to a thickness less than or equal to 0.9 quarter wave. The high refractive index material is selected from the group consisting of $GdF_3$ and $LaF_3$, and the low refractive index material is selected from the group consisting of $AlF_3$ and $MgF_2$.

In another embodiment the disclosure is directed to an optical element consisting of a substrate selected from the group consisting of $CaF_2$, $SiO_2$ and F—$SiO_2$; a first coating directly on the substrate, the coating being a high refractive index metal fluoride coating material; a low refractive index coating on top of the high refractive index material; and a capping layer on top of the low refractive index material; wherein each of the high refractive index and low refractive index metal fluorides have a thickness of less than or equal to 0.9 quarter wave, and the capping material has a thickness in the range of 5 nm to 25 nm. The high refractive index material on the element is selected from the group consisting of $GdF_3$ and $LaF_3$ and the low refractive index material on the element is selected from the group consisting of $AlF_3$ and $MgF_2$. The elements can be a mirror, lens, laser window or prism. When the substrate is a F—$SiO_2$ substrate the substrate contains 0.5 wt. % to 4.5 wt. % F.

The disclosure is also directed to a method for making an optical element having a coating thereon, the method comprising providing a substrate selected from the group consisting of $CaF_2$, $SiO_2$ and F—$SiO_2$, applying a coating of a high refractive index metal fluoride material to the surface of the substrate using vacuum deposition at a temperate greater than or equal to 300° C., the reverse mask technique, and in-situ or post-deposition plasma ion treatment; applying a coating of a low refractive index metal fluoride material to the surface of the high refractive index material using vacuum deposition at a temperate greater than or equal to 300° C., the reverse mask technique, and in-situ or post-deposition plasma ion treatment; and depositing a capping layer selected from the group consisting of $SiO_2$ and F—$SiO_2$ on top of the low refractive index material using vacuum deposition at a temperate greater than or equal to 300° C., the reverse mask technique, and in-situ or post-deposition plasma ion treatment; wherein the high index and low index materials are each deposited to a thickness of less than or equal to 0.9 quarter wave, and the capping material is deposited to a thickness in the range of 5 nm to 25 nm.

It will be apparent to those skilled in the art that various modifications and variations can be made to the present invention without departing from the spirit or scope of the invention. Thus, it is intended that the present invention cover modifications and variations of this invention provided they come within the scope of the appended claims and their equivalents.

We claim:

1. An optical coating for laser optics operating in the deep ultraviolet wavelength range, the coating comprising:
    a first layer comprising a high refractive index metal fluoride material, the first layer having a 0.78 quarter wave to a 0.90 quarter wave thickness;
    a second layer comprising a low refractive index metal fluoride material, the second layer having a 0.78 quarter wave to a 0.90 quarter wave thickness; and
    a third layer selected from the group consisting of $SiO_2$ and F—$SiO_2$,
    wherein thickness of the third layer is_in the range of 5 nm to 25 nm, and
wherein the coating exhibits a reflectance at a wavelength of 193 nm of less than 0.5% at an angle of incidence of 22 degrees.

2. The optical coating according to claim 1, wherein the high refractive index material is selected from the group consisting of $GdF_3$ and $LaF_3$.

3. The optical coating according to claim 1, wherein the low refractive index material is selected from the group consisting of $AlF_3$ and $MgF_2$.

4. An optical element for operating in the deep ultraviolet wavelength range comprising:
    a substrate selected from the group consisting of $CaF_2$, $SiO_2$ and F—$SiO_2$;
    an optical coating disposed on the substrate, the coating comprising:
        a first layer comprising_a high refractive index metal fluoride material, the first layer having a 0.78 quarter wave to a 0.90 quarter wave thickness;
        a second layer comprising a low refractive index metal fluoride material, the second layer having a 0.78 quarter wave to a 0.90 quarter wave thickness; and
        a third selected from the group consisting of $SiO_2$ and F—$SiO_2$,
    wherein the thickness of the third layer is_in the range of 5 nm to 25 nm.

5. The element according to claim 4, wherein the low refractive index material is selected from the group consisting of $AlF_3$ and $MgF_2$.

6. The element according to claim 4, wherein the element is a mirror, lens, laser window or prism.

7. The element according to claim 4, wherein the substrate is a F—$SiO_2$ substrate containing 0.5 wt. % to 4.5 wt. % F.

* * * * *